United States Patent [19]

Foster et al.

[11] Patent Number: 4,881,234
[45] Date of Patent: Nov. 14, 1989

[54] METHOD FOR FORMING COPIOUS $(F_2^+)_A$ CENTERS IN CERTAIN STABLE, BROADLY TUNABLE LASER-ACTIVE MATERIALS

[75] Inventors: David R. Foster, Falls Church; Irwin Schneider, Alexandria, both of Va.

[73] Assignee: The United States of America as represented by the Secretary of the Navy, Washington, D.C.

[21] Appl. No.: 27,473

[22] Filed: Mar. 18, 1987

[51] Int. Cl.$^4$ .............................................. H01S 3/16
[52] U.S. Cl. ..................................................... 372/42
[58] Field of Search ........................................ 372/42

[56] References Cited

U.S. PATENT DOCUMENTS

| 3,970,960 | 7/1976 | Mollenauer | 372/42 |
| 4,301,426 | 11/1981 | Schneider | 372/42 |
| 4,490,016 | 12/1984 | Schneider et al. | 350/397 |
| 4,519,082 | 5/1985 | Schneider | 372/42 |

OTHER PUBLICATIONS

Schneider "Lithium-$(F_2^+)_A$ Centers in Alkali-Halide Crystals", Optics Letters, Vol. 6, No. 3, pp. 157-158, Mar., 1981.
Schneider et al., "Broadly Tunable Laser Action Beyond 3 μm from $(F_2^+)_A$ Centers in Lithium-Doped KI", Optics Letters, Vol. 6, No. 12, pp. 627-628, Dec., 1981.
Foster et al., "$(F_2^+)_A$ Centers in Additively Colored Lithium-Doped Kl and KBr", Optics Letters, Vol. 11, No. 4, pp. 213-215, Apr., 1986.
I. Schneider et al., "Continuous-Wave Laser Action of $(F_2^+)_A$ Centers in Sodium-Doped KCl Crystals", reprinted from Optics Letters, Vol. 4, pp. 390-392, Dec., 1979.
Schneider et al., "Tunable, Continuous-Wave Laser Action Using $(F_2^+)_A$ Centers in Lithium-Doped KCl", Optical Letters, Vol. 5, No. 6, pp. 214-215, Jun., 1980.

Primary Examiner—John D. Lee
Assistant Examiner—Georgia Y. Epps
Attorney, Agent, or Firm—Thomas E. McDonnell; Edward F. Miles

[57] ABSTRACT $(F_2^+)_A$ color centers can be produced in additively-colored KI:Li or RbI:Li crystals provided that the material is colored in a nitrogen-free atmosphere. Copious $(F_2^+)_A$ centers are produced in lithium-doped KI:Li or RbI:Li crystals using a procedure in which the crystals are grown, additively colored, and annealed in an argon ambient; and optically excited at successively-lower temperatures with a light of a wavelength readily absorbed by the crystal situated in a vacuum.

2 Claims, 3 Drawing Sheets

METHOD FOR FORMING COPIOUS $(F_2^+)_A$ CENTERS IN CERTAIN STABLE, BROADLY TUNABLE LASER-ACTIVE MATERIALS

This invention relates to laser active materials selected from the group consisting of nitrogen free lithium-doped potassium iodide and lithium-doped rubidium iodide.

This invention also relates to the production of $(F_2^+)_A$ color centers in certain stable, broadly-tunable laser-active materials, applying in particular to the production of $(F_2^+)_A$-type color centers in certain alkali iodide crystals, namely potassium iodide (KI) and rubidium iodide (RbI), that are doped with lithium iodide (LiI) forming KI:Li and RbI:Li crystals having large concentrations of $(F_2^+)_A$ color centers.

BACKGROUND OF THE INVENTION

The laser-active material described in U.S. Pat. No. 4,519,082 to Irwin Schneider is a lithium-doped potassium iodide (KI:Li) crystal containing point defects consisting of $F_2^+$ and $(F_2^+)_A$ color centers. These color centers are produced in a crystal that is colored by ionizing radiation, annealed for several minutes near 250 degrees Kelvin (K) to form $F_2$, $(F_2)_A$, $F_2^+$, and $(F_2^+)_A$ centers, and then irradiated near 148K with green light to convert $F_2$ to $(F_2)_A$ centers and $F_2^+$ to $(F_2^+)_A$ centers. Color centers are known in the applicable technology and are described in the technical literature. This material, however, is of limited use because its application involves a complex coloration process demanding an expensive particle accelerator to produce high-energy electrons and requires difficult handling procedures in that the material must be continuously stored at low temperatures to preserve the $(F_2^+)_A$ centers, which would otherwise fade at high temperatures, such as room temperature (300K) The above limitations of the material have motivated the invention described herein below.

Additively-colored laser-active materials, such as sodium-doped potassium chloride (KCl:Na), and lithium doped potassium chloride (KCl:Li), are easily fabricated using a known enclosed-bomb technique; and laser-active $(F_2^+)_A$ centers are created by exposing the crystalline materials to near-uv or visible light. The term "additive coloration" as used herein refers to this advantageous technique that is used in the practice of the invention. Color centers in additively-colored crystals are long lived at room temperature. One might expect that the technique used to prepare any of the above mentioned crystals could be successfully applied to the formation of $(F_2^+)_A$ centers in additively-colored KI:Li (or RbI:Li) crystals, so that one would regard KI:Li (or RbI:Li) crystals containing $(F_2^+)_A$ centers to be desirable for use as laser-active materials. Unfortunately, all previous attempts to form $(F_2^+)_A$ centers in additively-colored KI:Li have failed for causes unrecognized until recently when we produced these laser-active centers for the first time in "additively-colored" KI:Li crystals.

Our discovery that nitrogen is a serious and previously unsuspected contaminant which diffuses into the KI or RbI lattice at elevated temperatures, especially during the additive coloration process, and chemically combines with isolated lithium in the lattice inhibiting the formation of $(F_2^+)_a$ centers, has led us to devise a process for additively coloring KI:Li and RbI:Li crystals.

Lithium-$(F_2^+)_A$ centers in potassium iodide are laser-active having a tuning range from 2.4 to 4.0 microns. The tuning range for these centers in rubidium iodide is predicted to extend from 2.6 to 4.2 microns. This wavelength range in the infrared spectral region is important in molecular photochemistry and spectroscopy since the range covers several fundamental stretch frequencies including the carbon-hydrogen (CH) and oxygen-hydrogen (OH) modes of organic and other materials. The lithium-doped potassium iodide laser-active material reported elsewhere by Irwin Schneider and Charles Marquardt in the technical literature is of limited use because the material must be "colored" at low temperatures with high-energy electrons to create various kinds of color centers subsequent to optical processing with visible electromagnetic energy, and requires continuous storage at low temperatures to preserve the laser-active $(F_2^+)_A$ centers as well as all other color centers. In contrast, "additively-colored" laser materials, for example, sodium-doped potassium chloride (KCl:Na) and lithium-doped potassium chloride (KCl:Li) that are "colored" at high temperature in the presence of an alkali metal vapor, do not require a source of high-energy electrons for coloration, and are easily colored through a simple thermal process Also, once colored, these materials show an indefinitely-long shelf-life near room temperature. Hence, the production of additively-colored KI:Li and RbI:Li crystals has evident advantages that become attainable through practice of the invention.

SUMMARY OF THE INVENTION

A related object of the invention is to successfully produce laser-active lithium-$(F_2^+)_A$ centers in additively-colored KI:Li crystals, RbI:Li crystals and other comparable crystalline materials, especially materials doped with lithium.

A principal object of the invention is to provide and produce additively-colored KI:Li and RbI:Li crystals in which $(F_2^+)_A$ color centers can be regenerated at will; these crystals and a method of manufacturing these crystals are provided by the invention.

Another object of the invention is to create $(F_2^+)_A$ centers in KI:Li and RbI:Li, or in comparable crystalline materials; by growing, coloring, and annealing the KI:Li or the RbI:Li crystals in nitrogen-free inert (e.g., argon) atmospheres.

Yet another object of the invention is to produce $(F_2^+)_A$ in KI:Li or in comparable materials (e.g., RbI:Li) that can be lased with broad tunability in the wavelength range from 2.4 to 4.0 microns m), and to produce these materials by a process uniquely suited to the purpose at hand The objects of the invention are met through the production of large concentrations of $(F_2^+)_A$ color centers in a desired laser-active material, such as KI:Li or RbI:Li, by growing, coloring, and annealing the crystals in a nitrogen-free inert atmosphere; and optically exciting the crystal with light of an appropriate wavelength as a last step for converting $(F_2)_A$ centers to $(F_2^+)_A$ centers. Argon is used as the inert gas during the growth, coloration, and anneal steps of the process. Other inert gases can be used as well, but argon is relatively inexpensive, and hence, is preferred. Avoidance of nitrogen during the coloration step is crucial to the success of the process. Careful selection of process conditions during the optical excitation step is essential to obtain optimum conversion of $F_2$ to $(F_2)_A$ centers and $(F_2)_A$ to $(F_2^+)_A$ centers.

This invention more specifically relates to the production of a large concentration laser-active lithium-$(F_2^+)_A$ centers in "additively-colored" potassium iodide or rubidium iodide (RbI), or in comparable crystalline materials. The production of these centers is achieved by growing the crystal boule, coloring and annealing crystal platelets cleaved from the boule of the chosen material, e.g , KI:Li or RbI:Li, in nitrogen-free inert atmospheres; and by optically exciting the crystal platelets with bluegreen light just prior to their use as laser-active materials. The invention utilizes our discovery that nitrogen diffuses into a KI or RbI lattice at elevated temperatures reached during the growth, coloration, and subsequent annealing stages. Nitrogen contamination of the crystals is most severe during the additive coloration step where high temperatures are reached and maintained for a relatively long interval. The nitrogen incorporated into the crystals (namely KI:Li and RbI:Li) combines with isolated lithium and, thereby, inhibits the formation of lithium-$(F_2^+)_A$ centers in the crystals. Because nitrogen contamination of these particular crystals is detrimental to the desired results, nitrogen ambients are avoided entirely throughout our process for producing lithium-$(F_2^+)_A$ color centers in KI:Li and RbI:Li crystals.

BRIEF DESCRIPTION OF THE PREFERRED EMBODIMENT OF THE INVENTION

Figure 1:
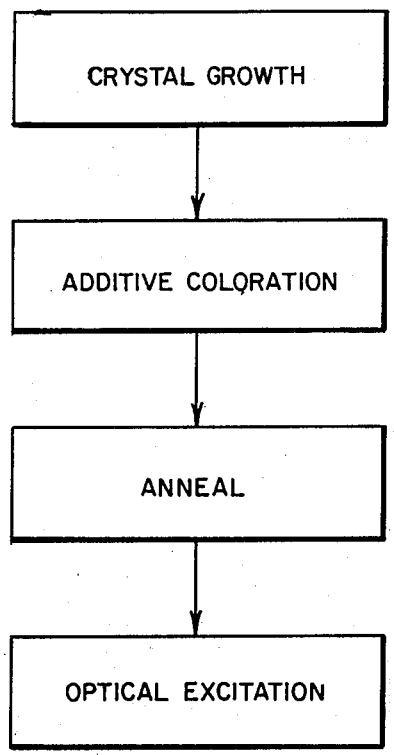
FIG. 1 is a flow chart of a process for producing copious $(F_2^+)_A$ color centers in laser-active materials, namely KI:Li and RbI:Li, in accordance with the principles of the invention.

The $(F_2^+)_A$ or centers formed and preserved by practice of this invention are lithium-$(F_2^+)_A$ centers in a crystal selected from the group of materials consisting of lithium-doped potassium iodide (KI:Li) and lithium-doped rubidium iodide (RbI:Li). These centers are formed in a KI:Li or a RbI:Li crystal by performing a sequence of process steps outlined by the flow chart of FIG. 1.

The process of the invention has four main steps: crystal growth, crystal coloration, crystal anneal prior to use, and crystal exposure to optical excitation at successively lower temperatures below 300K. These steps are shown in the block diagram of FIG. 1 which pertains to KI:Li and RbI:Li crystal fabrication.

First, a crystal is grown by melting the alkali-halide salt, such as potassium iodide in powder form, with 1 mole % lithium iodide powder in a platinum crucible situated in an argon atmosphere. A potassium iodide seed crystal is used to grow a boule of lithium-doped potassium iodide from the melt. Boules of lithium-doped rubidium iodide are grown in a similar fashion. The purpose of this step is to grow optical quality KI and RbI crystal boules containing Li dopant.

Figure 2:
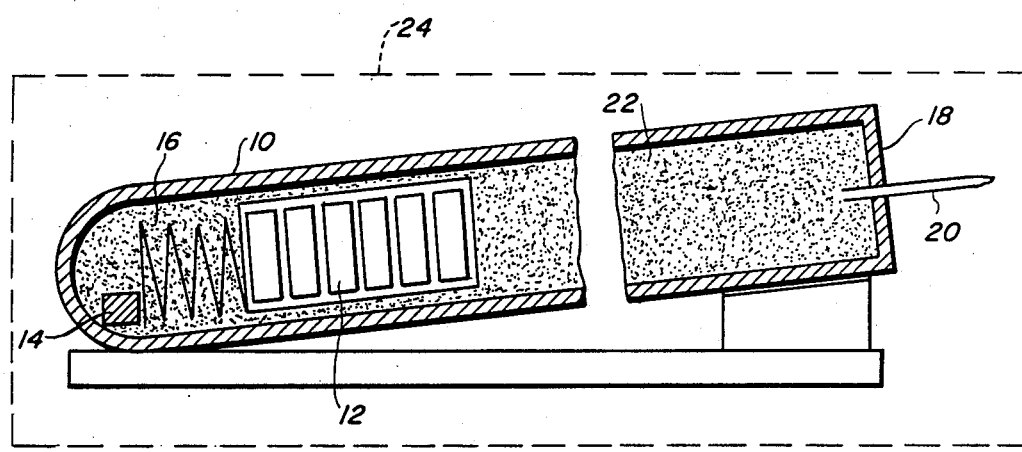
FIG. 2 is a diagrammatic representation of a crystal colorization step crucial to the process of the invention.

Next, the boule is cleaved into crystal platelets and each platelet is wrapped in aluminum foil keeping two end surfaces uncovered. The wrapped platelets are wrapped together in a larger sized aluminum foil and are placed into a stainless steel tube 10 already containing a potassium metal pellet and a spacer in a fashion shown in FIG. 2 wherein the tube 10 is shown in an inclined position on supports, 11a and 11b, with 6–12 foil-wrapped platelets 12 situated in tube 10. In FIG. 2 the larger sized foil is cutaway to show the individually wrapped platelets which rest against the cylindrical tube wall. The foil around the platelets is usually aluminum, and provides a uniform temperature around the platelets. A potassium metal pellet 14 placed into the lower end of tube 10 is separated from the foil-wrapped platelets 12 by a crumpled wad of aluminum foil 16 serving as a spacer between pellet 14 and platelets 12. The upper end of tube 10 is welded shut by a stainless steel plug 18 surrounding a thin metal tube 20 passing through the plug 16 into the tube's interior. Tube 10 contains an inert gas 22, typically, but not necessarily, argon that was introduced into the tube interior by evacuating the tube tube 10, backfilling the tube interior with an inert gas (e.g., argon) atmosphere, and then pinching-off the small tube 20 to encapsulate the inert gas, the pellet 14, the spacer 16, and the foil-wrapped platelets 12 in the tube 10. Thin tube 20 is welded at the pinched end, as shown, so that the tube 10 is hermetically sealed.

Coloration of crystalline platelets 12 is performed by heating the sealed tube 10 and its contents in a cylindrical furnace chamber, indicated in outline by dashed lines 24, to a suitable temperature, 850–873 degrees Kelvin. This range is chosen 50 to 200K below the melting point of the platelets so that color centers readily diffuse within the lattice. The temperature is also well above the melting point of the potassium metal pellet 14, which creates a high vapor-pressure of metal inside the tube. Aluminum foil is used to wrap the platelets because it does not melt at the coloration temperature. Other metal foils can also be used. The tube and crystals are maintained at 850–873K for a 4–16 hour period, which is generally sufficient to achieve a uniform distribution and high concentration of color centers in the platelets. This step is a crucial and integral part of the overall process by which invention is successfully practiced since the procedure is performed in a nitrogen-free argon atmosphere to prevent nitrogen contamination of the crystals. Tube 10 is quenched to room temperature by placing it into a cold water bath. The purpose of the additive coloration step is to create a large concentration of F and $F_2$ centers by bringing the crystal into equilibrium with a bath of alkali metal vapor while avoiding nitrogen contamination.

The colored crystals are stored near room temperature for an indefinite period. Before use, the crystal platelets 12 are again wrapped in aluminum foil and annealed at a temperature of 50 to 100 degrees Kelvin below the platelet melt temperature, at 825–875K, for several minutes in an argon atmosphere and then rapidly quenched from the anneal temperature down to room temperature (300K). This quenching can be done by gently pressing the wrapped crystals against a block of metal at room temperature or by placing the crystals in a strong flow of cool argon. The purpose of this anneal step is to disperse colloids that form during the additive coloration step.

A platelet is then removed from the aluminum foil, polished, mounted onto an optical Dewar, and subjected to optical exposures at progressively lower temperatures to produce the appropriate laser-active color centers in the fourth, and last, process step.

Figure 3:
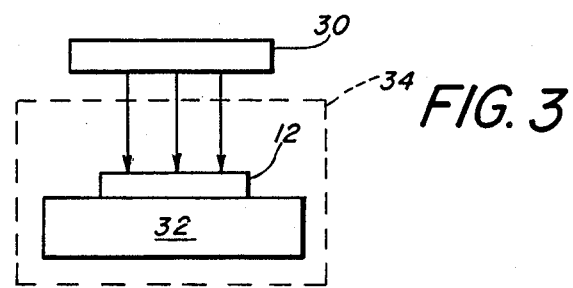
FIG. 3 shows a crystal mounted on a cold finger of a Dewar during the optical excitation of the crystal.

Blue-green light, having a wavelength in the 400–540 nanometer spectral region, derived from either a conventional light source or a laser 30 (e.g., an Argon ion laser), is directed uniformily onto the KI:Li or RbI:Li platelet 12 while platelet 12 is mounted on a cold finger 32 of a Dewar under a vacuum of $10^{-6}$ torr or less maintained in a region 34 containing the platelet as shown in FIG. 3. The purpose of this step is to form laser-active $(F_2^+)_A$ centers through optical and thermal treatments.

At this point in our discussion we wish to note that emphasis has been given in our work to the fabricaton of KI:Li crystals, yet the overall process is clearly applicable to the fabrication of RbI:Li crystals.

EXAMPLE

All KI crystals were grown via the Kyropoulus technique in an argon atmosphere with 1 mole percent (mol %) lithium iodide (LiI) added to the melt. Crystal samples were usually cleaved approximately 3 mm×5 mm×10 mm from the bottom of each boule, and contained approximately 0.1 mol % of the lithium iodide, as determined by atomic absorption analysis. These crystals were "additively-colored" with approximately 2 grams of potassium metal in a sealed stainless-steel tube, as previously described. Tubes containing KI:Li crystals were sealed after being evacuated and backfilled with argon to atmospheric pressure. KI:Li crystals were colored at 850–873K for 4–16 hours. Immediately before use, each KI:Li sample was annealed at 825–875K for several minutes in an argon atmosphere and rapidly quenched to room temperature. The duration of the anneal depended on crystal thickness. Four to six minute anneals were required for crystals 1 to 2 millimeters thick.

All absorption spectra are measured using a Cary Model 14 MR spectrophotometer. Emission from the platelet is produced with excitation light from a tungsten lamp and monochromator, and is viewed at 90° to the excitation. The emission is passed through a grating monochromator and germanium filter to a liquid-nitrogen-cooled Indium Antiminide (InSb) detector.

Figure 4:
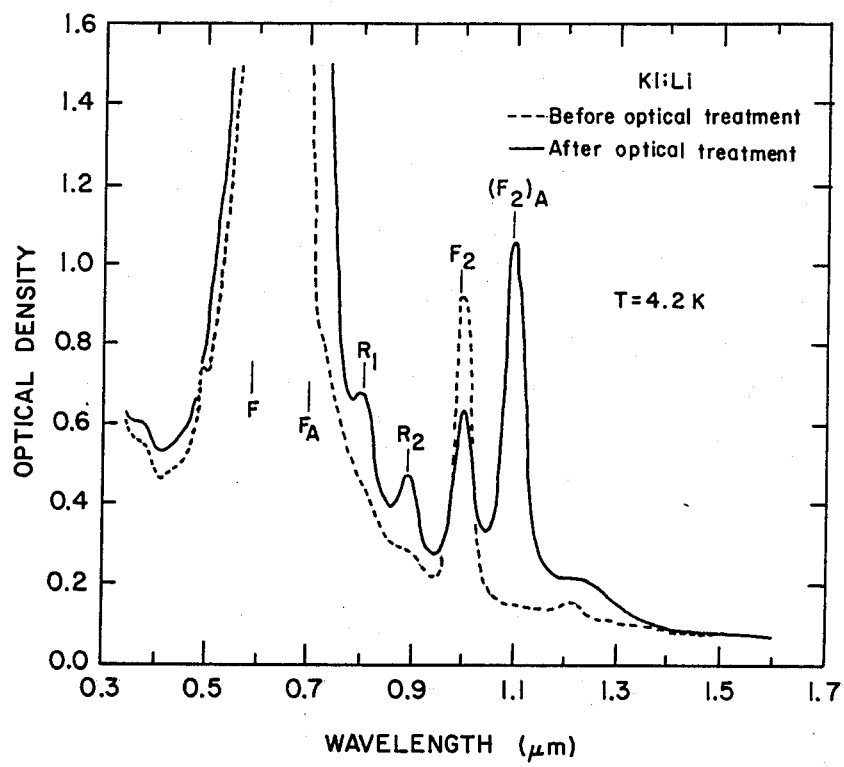
FIG. 4 shows absorption spectra of a typical additively-colored KI:Li crystal, 1 millimeter thick, measured after the anneal step and after the conversion of $F_2$ to $(F_2^+)_A$ centers.
Figure 5:
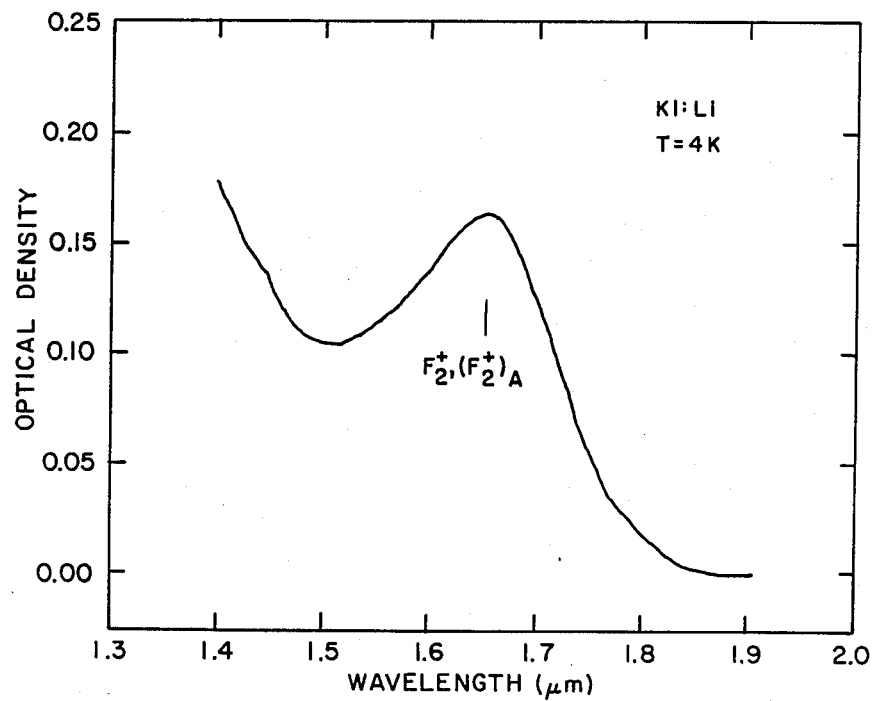
FIG. 5 shows absorption changes induced by blue-green light at low temperature for an additively-colored KI:Li crystal, 5 millimeters thick, in which $(F_2^+)_A$ centers are produced using the method of the invention.

$(F_2^+)_A$ centers in KI:Li crystals were produced using a procedure similar to that employed for other alkali-halide host crystals. Freshly quenched crystals containing F centers and $F_2$ centers (see the dashed curve in FIG. 4) were exposed to blue-green light (400–540 nanometers) at successively lower temperatures. The light source was a 200 watt super pressure mercury lamp filtered through a copper sulfate ($CuSO_4$) solution and a 0–52 Corning glass filter. An initial 5 minute exposure of the crystal to blue-green light at 250–270K partly converted F centers to $F_A, F_2$, and some $(F_2)_A$ centers. This was followed by a 4–10 hour exposure of the crystal to blue-green light at 150–200K to convert most of the $F_2$ centers to $(F_2)_A$ centers. FIG. 5 shows that this optical treatment produces a relatively strong absorption at 1.10 microns and weaker absorptions due to $F_2$ centers at 1.01 microns and R (or $F_3$) centers at 0.812 and 0.898 microns (see the solid curve in FIG. 4). $F_A$ centers in KI:Li produce an unresolved absorption in the F-band region The absorption spectra shown in FIG. 4 were measured after the crystal was exposed to red light to neutralize the charged centers produced by blue-green light.

Figure 6:
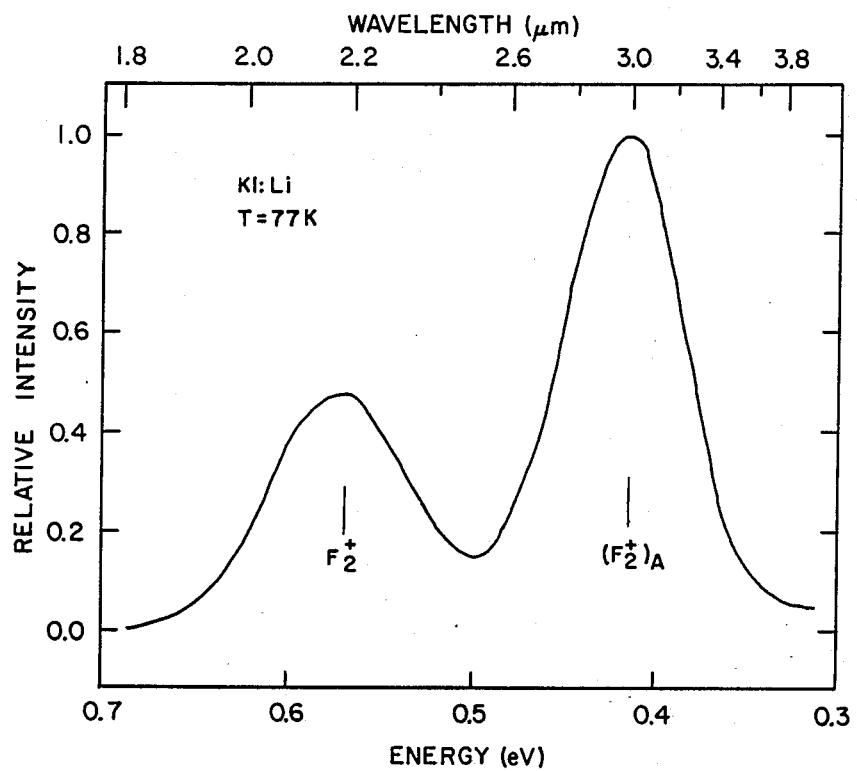
FIG. 6 shows the normalized emission spectrum measured for $F_2^+$ and $(F_2^+)_A$ centers in KI:Li using 1.60 micron excitation.
Figure 7:
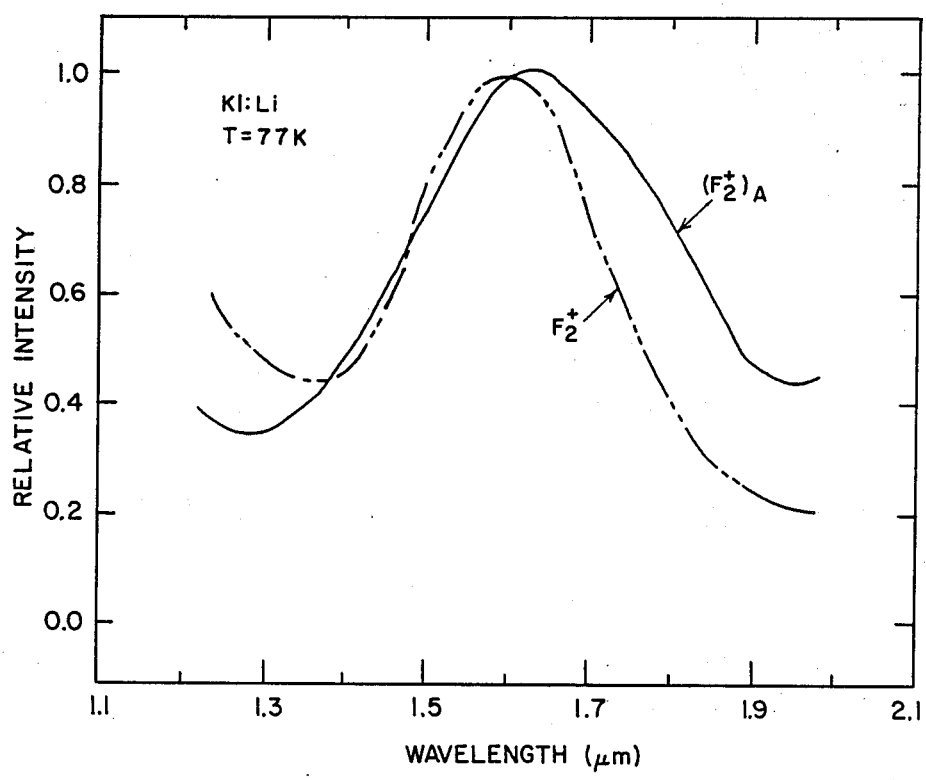
FIG. 7 shows the normalized excitation spectra measured at 77 degrees Kelvin for the $F_2^+$ and $(F_2^+)_A$ emission bands centered at 2.16 and 3.00 microns, respectively.

$(F_2^+)_A$ centers in KI:Li were produced by exposing KI:Li crystals containing $(F_2)_A$ centers for 10–60 sec to blue-green light at or below 77K. The $(F_2)_A$ centers absorb the blue-green light and ionize with electrons being trapped by $F_A$ and F centers, i.e., forming $F_A^-$ and $F^-$ centers, respectively. FIG. 4 shows that at 4K this exposure produces an absorption at approximately 1.65 microns due to the overlap of the $F_2^+$ and $(F_2^+)$ bands, which overlaps the trailing edge of the F' band. Similar results are obtained at 77K. Excitation of the $(F_2^+)_A$ centers in KI:Li at 1.65 microns produces two emission bands, shown in FIG. 6. The $(F_2^+)_A$ and $F_2^+$ centers give rise to emission bands peaking at 3.00 and 2.16 microns, respectively. FIG. 7 shows that the 3.00 and 2.16 micron emissions have excitation bands centered at 1.63 and 1.60 microns, respectively. The peak positions of these emission and excitation bands are in agreement with data and assignments obtained for electron-beam-colored crystals. As in other laser-active $(F_2^+)_A$ materials, the $(F_2^+)_A$-center population was fully sustained during emission measurements through exposure to an auxiliary visible/near-UV source (400–540 nanometers).

Table I lists the measured absorption (Abs.) and emission (Em.) band positions for KI and RbI crystals doped with lithium (Li).

TABLE 1

$F_2, F_2^+, (F_2)_A, (F_2^+)_A$ Center Absorption and Emission Band Peaks at 77K (μm)

| Type of Center | KI | | RbI | |
| --- | --- | --- | --- | --- |
| | Abs. | Em. | Abs. | Em. |
| $F_2$ | $1.01^b$ | 1.50 | 1.10 | — |
| $F_2^+$ | 1.60 | 2.16 | 1.77 | — |
| Lithium $(F_2)_A$ | $1.10^b$ | 1.80 | 1.77 | 2.22 |
| Lithium $(F_2^+)_A$ | 1.63 | 3.00 | 1.86 | 3.20 |

KI:Li crystals containing $(F_2)_A$ and $(F_2^+)_A$ centers were also tested for their storage capability at room temperature. $(F_2)_A$ and $(F_2^+)_A$ centers revert to $F_2$ centers within minutes at room temperature but are completely regenerated by illuminating the crystal with blue-green light (400–540 nanometers) at 200 K. Storage of KI:Li at room temperature for much longer periods of time (i.e., over several days) results in the reversion of some color centers to colloids. These color centers can be regenerated by simply reannealing the KI:Li crystals for about 1 minute at 848 K. These additively-colored crystals differ from electron-beam-colored crystals because the laser-active $(F_2^+)_A$ centers are completely restored on cycling between 300K (room temperature) and 77K (liquid nitrogen temperature).

Experiments have clearly established that $(F_2^+)_A$ centers cannot be produced in KI:Li crystals that were additively colored in an atmosphere containing nitrogen. Hence, nitrogen is avoided throughout the process practicing this invention. KI:Li crystals colored in a nitrogen atmosphere were brown compared to the deep blue of crystals colored in a tube backfilled with argon. Undoped KI and sodium (Na)-doped KI were dark blue regardless of which gas (nitrogen or argon) was used. The brown color in KI:Li can be attributed to colloids mentioned earlier, which can be eliminated by annealing the crystals. After exposure to blue-green light at successively lower temperatures, nitrogen-contaminated KI:Li crystals exhibited a weak absorption in the $(F_2)_A$-band region similar to that reported elsewhere by others, but this band could not be optically enhanced through conversion from $F_2$ centers. There was no spectroscopic evidence for the presence of $(F_2^+)_A$ centers in this material. This is in accordance with the realization that nitrogen contaminates of the KI:Li crystals We anticipate that the formation of $(F_2)_A$ and $(F_2^+)_A$ centers in RbI:Li crystals is similar to their formation in KI:Li. $(F_2)_A$ centers can be produced in RbI:Li through exposure to blue-green light for 5 minutes at 250–270K and for 4–10 hours at 150–200K. The centers can then be ionized with blue-green light at 77K. The results for additively-colored RbI:Li should be qualitatively identical with those reported for electron-beam-colored crystals and are presented in Table 1.

In summary, lithium-$(F_2^+)_A$ color centers are now produced in additively-colored KI:Li, and can be produced in RbI:Li by following similar procedures. Formation of $(F_2^+)_A$ centers in KI:Li or RbI:Li requires the elimination of nitrogen during the crystal growth, additive coloration, and annealing stages of crystal preparation. These laser-active centers in additively-colored KI:Li or RbI:Li offer the possibility of achieving a stable laser material that can be tuned to 2.4 to 4.0 microns.

Stable, laser active materials containing $F_A$ centers of the prior art have another limitation: they can be tuned to lase over relatively narrow spectral wavelengths ranges: 2.2 to 2.74 microns for KCl:Na, 2.32 to 3.12 microns for KCl:Li, and 2.48 to 3.64 microns for RbCl:Li. Laser-active materials tunable over a much wider range of wavelengths are desirable, and are provided by the invention.

The KI:Li crystals produced by the above-described method can be tuned to lase at any wavelength within a range from 2.4 to 4.0 microns. A broadly-tunable infrared laser in this spectral region has important applications including, but not necessarily limited to: high-resolution spectroscopy of inorganic and organic materials, molecular photochemistry, detection of atmospheric pollutants, physics of narrow-bandpass semiconductors, and fiber optic communications.

The above-described technique has two outstanding advantages when compared to the known electron-beam-irradiation technique for producing KI:Li laser-active material in the fashion described in U.S. Pat. No. 4,519,082 by Irwin Schneider. First, the material can be produced by a simple additive-coloration technique. Second, the color centers are temperature stable and do not fade when the material is stored for short periods at room temperature. After long-term storage at room temperature, the crystals are easily restored with a simple anneal. This is in contrast to their behavior in electron-beam-colored materials where the centers irreversibly fade at room temperature.

Lithium-$(F_2^+)_A$ centers form in KI at low temperatures through a photodynamic balance between $(F_2)_A$ and $(F_2^+)_A$ centers during the last stage of the formation process. The optical properties of lithium-doped potassium iodide (KI:Li), produced by our modified additive-colorization process, are identical with those previously reported by Irwin Schneider for "electron-beam colored" crystal materials. However, the new crystal fabrication process herein described is entirely different from the process involving electron-beam coloration.

Obviously many modifications and variations of the invention are possible in light of the above teachings. It is therefore to be understood that within the scope of the appended claims the invention may be practiced otherwise than as specifically described.

We claim:

1. A laser-active material having regenerable color centers, comprising: a lithium-doped potassium iodide crystal free of nitrogen contamination and having points defects consisting of $F_2$, $F_{2A}$, $F_2+$ and $(F_2+)_A$ color centers in the crystal structure, the $(F_2+)_A$ color centers being laser-active regenerable color centers.

2. A laser-active material having regenerable $(F_2+)_A$ color centers, comprising: a lithium-doped rubidium iodide crystal free of nitrogen contamination and having point defects consisting of $F_2$, $(F_2)_A$, $F_2+$ and $(F_2+)_A$ color centers in a crystal structure, the $(F_2+)_A$ color centers being laser-active regenerable color centers.

* * * * *